(12) United States Patent
Hatakeyama et al.

(10) Patent No.: US 9,274,428 B2
(45) Date of Patent: Mar. 1, 2016

(54) RESIST TOP COAT COMPOSITION AND PATTERNING PROCESS

(71) Applicants: Shin-Etsu Chemical Co., Ltd., Tokyo (JP); SAMSUNG ELECTRONICS CO., LTD., Gyeonggi-do (KR)

(72) Inventors: Jun Hatakeyama, Niigata (JP); Hyun-Woo Kim, Gyeonggi-do (KR)

(73) Assignees: SHIN-ETSU CHEMICAL CO., LTD., Tokyo (JP); SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/444,169

(22) Filed: Jul. 28, 2014

(65) Prior Publication Data

US 2015/0030983 A1    Jan. 29, 2015

(30) Foreign Application Priority Data

Jul. 29, 2013  (JP) ................................ 2013-156354

(51) Int. Cl.

| | |
|---|---|
| *G03F 7/11* | (2006.01) |
| *G03F 7/039* | (2006.01) |
| *G03F 7/32* | (2006.01) |
| *G03F 7/30* | (2006.01) |
| *G03F 7/20* | (2006.01) |
| *G03F 7/09* | (2006.01) |
| *C08F 214/18* | (2006.01) |
| *C08F 232/08* | (2006.01) |
| *C08F 212/08* | (2006.01) |
| *C08F 12/20* | (2006.01) |
| *C08F 12/24* | (2006.01) |
| *C09D 125/18* | (2006.01) |

(52) U.S. Cl.
CPC . *G03F 7/11* (2013.01); *C08F 12/20* (2013.01); *C08F 12/24* (2013.01); *C08F 212/08* (2013.01); *C08F 214/182* (2013.01); *C08F 214/186* (2013.01); *C08F 232/08* (2013.01); *C09D 125/18* (2013.01); *G03F 7/0392* (2013.01); *G03F 7/09* (2013.01); *G03F 7/2037* (2013.01); *G03F 7/2041* (2013.01); *G03F 7/30* (2013.01); *G03F 7/322* (2013.01)

(58) Field of Classification Search
None
See application file for complete search history.

(56) References Cited

U.S. PATENT DOCUMENTS

| | | | |
|---|---|---|---|
| 4,740,451 A | 4/1988 | Kohara | |
| 8,715,911 B2 | 5/2014 | Kim et al. | |
| 2005/0277059 A1* | 12/2005 | Kanda | 430/270.1 |
| 2010/0183976 A1* | 7/2010 | Wang et al. | 430/270.1 |
| 2012/0021355 A1 | 1/2012 | Kim et al. | |
| 2013/0209922 A1* | 8/2013 | Masunaga et al. | 430/5 |

FOREIGN PATENT DOCUMENTS

| | | |
|---|---|---|
| JP | 09-246173 | 9/1997 |
| JP | 2005-352384 | 12/2005 |
| JP | 2006-178317 | 7/2006 |
| JP | 2007-316581 | 12/2007 |
| JP | 2008-065304 | 3/2008 |
| JP | 2008-111103 | 5/2008 |
| JP | 2010-237661 | 10/2010 |
| KR | 100053959 | 8/1992 |
| KR | 1020040009384 | 1/2004 |
| KR | 1020050000180 | 1/2005 |
| KR | 1020050031257 | 4/2005 |
| KR | 1020050044501 | 5/2005 |
| KR | 1020080014388 | 2/2008 |
| KR | 1020080089265 | 10/2008 |

OTHER PUBLICATIONS

DERWENT English abstract for JP2008-65304 (2008).*
Machine-assisted English translation for JP2008-65304 (2008), provided by JPO.*
Hyun-Woo Kim et al., "CD uniformity improvement for EUV resists process: EUV resolution enhancement layer", Extreme Ultraviolet (UV) Litography II, edited by Bruno M. La Fontaine, Patrick P. Naulleau, Proc. of SPIE vol. 7969, pp. 796916-1-796916-10, 2011.

* cited by examiner

*Primary Examiner* — Sin Lee
(74) *Attorney, Agent, or Firm* — F. Chau & Associates, LLC

(57) ABSTRACT

A resist top coat composition includes a polymer including a base resin having a repeating unit p of styrene having a 1,1,1,3,3,3-hexafluoro-2-propanol group and a repeating unit q of acenaphthylene having chemical formula 1. R is hydrogen, hydroxyl. $R^1$ is hydrogen, hydroxyl, linear or branched C1-C10-alkyl, cycloalkyl, acyloxy, alkoxycarbonyl, carboxyl, —OC(=O)$R^2$. $R^2$ is linear or branched C1-C10-alkyl, cycloalkyl or fluorinated alkyl. m is 1 or 2. p and q are positive numbers satisfying the expressions $0<p<1.0$ and $0<q<1.0$, and $0<p+q\leq1.0$.

17 Claims, 2 Drawing Sheets

RESIST TOP COAT COMPOSITION AND PATTERNING PROCESS

CROSS-REFERENCE TO RELATED APPLICATION

This U.S. non-provisional patent application claims priority under 35 U.S.C. §119 to Japanese Patent Application No. 2013-156354, filed on Jul. 29, 2013, the disclosure of which is incorporated by reference herein in its entirety.

TECHNICAL FIELD

Exemplary embodiments of the present inventive concept relate to a resist top coat composition, and more particularly to a patterning process using that composition.

DISCUSSION OF RELATED ART

As large scale integration (LSI) progresses toward a higher integration and a higher processing speed, pattern miniaturization may progress rapidly. In the background of this rapid progress of miniaturization, a shift may occur in projection lenses to a higher numerical aperture (NA), increased resist composition performance, and shorter wavelengths.

A resist composition for a KrF excimer laser (248 nm) may be a 0.3 µm process, and may be applied to mass-production of a 0.13-µm rule. Shifting to a shorter wavelength from a KrF excimer laser to an ArF excimer laser (193 nm) may miniaturize a design rule to 0.13 µm or less, but resins such as a novolak resin or a polyvinyl phenol resin, may have strong absorption near 193 nm, and might not be useful as a resist base resin. To increase transparency and dry-etching resistance, an acryl resin and a cycloolefin-based alicyclic resin may be used and mass-production of a device using ArF lithography may be realized.

In a 45-nm node device, the wavelength of exposure light may be shortened, and thus $F_2$ lithography of 157 nm may be a candidate for KrF lithography. However, $F_2$ lithography may include a change of the optical system due to the relatively low durability of a soft pellicle, thereby leading to introduction of a hard pellicle; and decreased etching resistance of a resist film. Thus, postponement of $F_2$ lithography and early introduction of ArF immersion lithography may be used, and a 45-nm node device using ArF immersion lithography may be produced on a large scale. For mass-production of a 32-nm node device, a double patterning process using a side-wall spacer may be used.

For a 32-nm device an extreme UV (EUV) lithography of 13.5 nm may be desired, and the resolution thereof may be increased by shifting the exposure light to a wavelength that is shorter by more than one digit. In EUV lithography, the power of a laser may be relatively weak, and the amount of light may be decreased because of attenuation of reflective mirror light, and thus the intensity of light reaching a wafer surface may be relatively low. Development of a highly sensitive resist film is desired. However, if the resist sensitivity of the resist film is increased, there may be a deterioration in resolution and edge roughness (e.g., line edge roughness: LER and line width roughness: LWR), and thus a trade-off relationship between increased sensitivity and the deterioration in resolution and edge roughness may exist.

The EUV resist material may be affected by its environment because of its sensitivity. An amine quencher may be added to a chemically amplified resist material to reduce the effect of amine contamination in air, but the amount of the amine quencher added to the EUV resist material may be a relatively small fraction of the amount of the amine quencher added in the ArF resist material. The EUV resist material may form a T-top configuration by receiving the effect of the amine from the surface of a resist film. The formation of a top coat on a resist film's upper layer may reduce the environmental effects. In a chemically amplified resist material of a KrF excimer laser based on a t-BOC (tert-butoxycarbonyl)-protected polyhydroxy styrene, to which an amine quencher was not added, a top coat may be used. In an ArF immersion lithography, a top coat may be used to prevent elution of an acid generator into water, thereby preventing formation of a T-top configuration that may be caused by such elution. In the EUV lithography process, a top coat may be formed on the resist upper layer (Nonpatent Document 1: Proc. SPIE Vol. 7969, p 796916-1 (2011)). By forming a top coat, environmental resistance can be increased and outgoing gas from a resist film can be reduced. A repeating unit having a carboxyl group and/or a repeating unit having a sulfo group are described in Japanese Unexamined Patent Application Publication No. 2008-65304. Examples of the acid generators are described in Paragraphs [0122] to [1042] of Japanese Unexamined Patent Application Publication No. 2008-111103, which also describes exemplary surfactants at paragraphs [0165] TO [0166] and exemplary amine quenchers at Paragraphs of [0146] to [0164].

In an EUV laser of DPP and LPP oscillates, in addition to light of a wavelength of 13.5 nm which may be used for patterning, a weak broad light having a wavelength of 140 nm to 300 nm (out-of-band, OOB) may be used. The intensity of the broad light may be relatively weak, but may have a wide wavelength range. A Zr filter may be used with an EUV microstepper to cut the OOB light, but may decrease light intensity. In an EUV scanner in which a light intensity is not decreased, a filter might not be used. Nonpatent Document 1 shows the use of a top coat to shield the OOB light on the resist upper layer.

Many materials have been proposed for use as a resist top coat in ArF immersion lithography. Among the proposed materials, Patent Document 1 (Japanese Unexamined Patent Application Publication No. 2005-352384) discloses a top coat composition including a repeating unit of styrene having a 1,1,1,3,3,3-hexafluoro-2-propanol (HFA) group, which may have relatively high absorption at a wavelength of 193 nm.

In a top coat for an immersion lithography, a solvent for a top coat may dissolve the surface of a resist film, and mixing may occur between the top coat and the resist film, and this may cause film loss of a resist pattern after development (Patent Document 2: Japanese Patent No. 4771083). A solution may be mixed with the solvent for the photoresist (see for example, Japanese Unexamined Patent Application Publication No. H09-246173). When an alcohol solvent is used, the film loss may be more prominent. An ether solvent may inhibit film loss. An example of a polymer that is soluble in ether solvents is a polymer that has a 1,1,1,3,3,3-hexafluoro-2-propanol (HFA) group, as described in Patent Document 2. However, fluorine atoms in a polymer may absorb EUV light, and if a HFA-containing polymer is used as a top coat of a resist upper layer, the sensitivity of the resist film may be lowered after patterning.

Non-patent Document 1 reports that (1) in the case of a positive-type resist film, when an entire wafer is exposed, the width of the lines in the peripheral section of a shot may become thinner due to out-of-band (OOB) light which may be leaked from neighboring shots; and (2) if a top coat that absorbs light having a wavelength of 200 nm to 300 nm is applied on a resist film, the variation of pattern size within a shot can be reduced. A positive-type resist film is described in chemical formula 22 in Paragraph 0041 of Japanese Unexamined Patent Application Publication No. 2010-237661, which also describes an acid generating group bonded to a main chain in chemical formula 21 in paragraph 0038.

Patent Document 3 (United States Patent Application Publication No. 2012/0021355) proposes a top coat of a hydroxystyrene or a cresol-novolak resin applied as a solution of alcoholic solvents such as 4-methyl-2-pentanol, 2-methyl-2-pentanol, isopropyl alcohol, 3,3,5-trimethyl-1-hexanol.

A top coat according to exemplary embodiments of the present inventive concept, as described in more detail below, may reduce the effects from the environment on a resist film, may absorb OOB light, and may reduce film loss of a resist pattern and bridging between patterns. The top coat may be soluble in an alkaline developer and may be simultaneously removed when the resist film is being developed. A patterning process including the top coat may be less complex than that of a top coat of a solvent removal type.

At 13.5 nm, a hydrogen atom, a carbon atom, a silicon atom, and a sulfur atom may have low absorption, and an oxygen atom and a fluorine atom may have high absorption. A fluorinated polymer may have high absorption at 13.5 nm. When a resist top coat is absorptive, the sensitivity of the resist film may be decreased. In EUV lithography having relatively low laser power, reduced sensitivity of the resist film may occur and a highly transparent resist top coat may be desired. The fluorinated polymer, which might not be soluble in an alkaline developer, may include a separating cup for removal of the resist top coat before development. The top coat according to exemplary embodiments of the present inventive concept may be removed substantially simultaneously with development of the resist film, and a material having an alkaline-soluble group may be included in the top coat composition.

A carboxyl group, a phenol group, a sulfo group, a hexafluoroalcohol group, and the like may be used as the alkaline-soluble group. A hexafluoroalcohol group may be highly absorptive due to it having six fluorine atoms. A polymer having a hexafluoroalcohol group may have relatively high solubility in ether solvents that do little damage to a resist film.

A resist material may be based on a polyhydroxy styrene may generate an acid by exposure to EUV. Sensitivity may be increased by a sensitization effect due to exposure to EUV, which may cause an energy transfer from a phenol group to an acid generator. The resist material based on a polyhydroxy styrene may increase sensitivity of the resist material.

The resist material may include an acid generator (PAG) bound to a polymer main chain. When an acid generator of a sulfonium salt or an iodonium salt having a sulfonic acid bound to a polymer main chain is used, reduced sharpness due to acid diffusion may be reduced by shortening of the acid diffusion distance in fine patterning (Japanese Patent No. 4425776). One drawback of a resist film having a bound PAG is its low sensitivity. Accordingly, enhancement of sensitivity is sought by copolymerizing thereof with a hydroxy styrene or the like that has a phenol group. However, copolymerization with a monomer having a phenol group, which enhances the alkaline-dissolution rate, causes film loss of a resist pattern, which is not desirable. As discussed above, development of a resist material that is highly sensitive and low in film loss of a pattern after development is wanted.

BRIEF DESCRIPTION OF THE DRAWINGS

The above and other features of the inventive concept will become more apparent by describing in detail exemplary embodiments thereof, with reference to the accompanying drawings, in which.

SUMMARY

Figure 1:
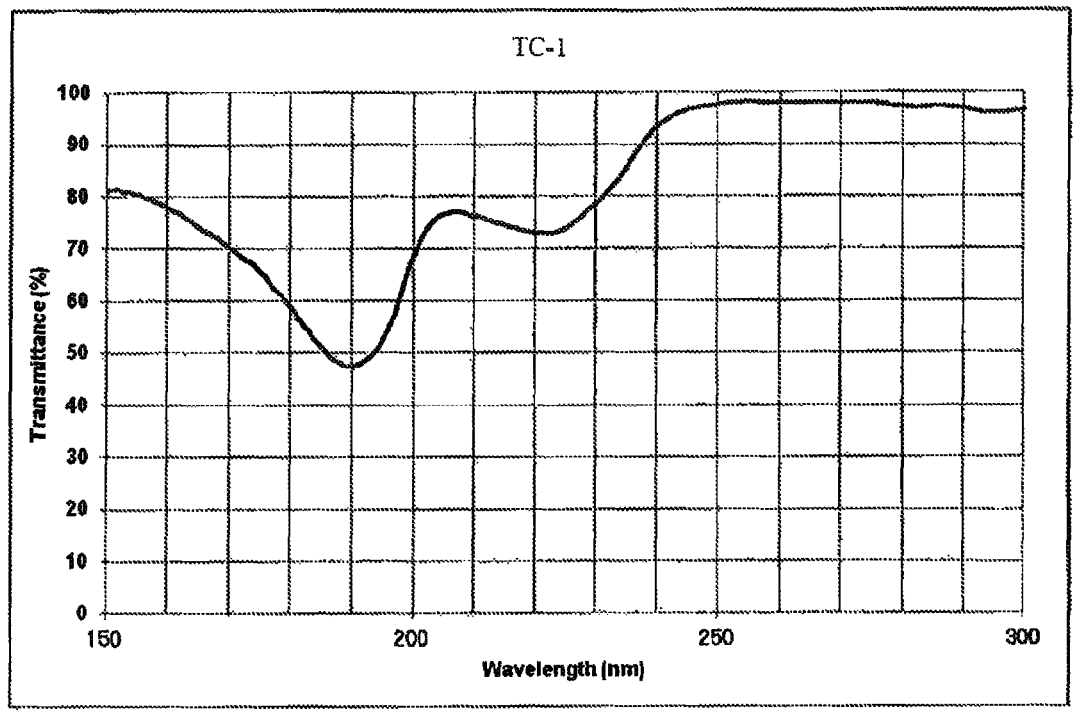
FIG. 1 is a chart showing spectral characteristics of the top coat solution TC-1 according to an exemplary embodiment of the present inventive concept.

Exemplary embodiments of the present inventive concept may provide a resist top coat composition that shields against OOB light, and reduces film loss of a resist pattern and bridging between patterns. Exemplary embodiments of the present inventive concept may increase the sensitivity of the resist film, and may decrease the emission of an outgoing gas from the resist film. Exemplary embodiments of the present inventive concept may provide a patterning process using the resist top coat composition.

According to exemplary embodiments of the present inventive concept, a resist top coat composition includes a polymer including a base resin having a repeating unit p of styrene having a 1,1,1,3,3,3-hexafluoro-2-propanol group and a repeating unit q of acenaphthylene having chemical formula 1:

Chemical formula 1

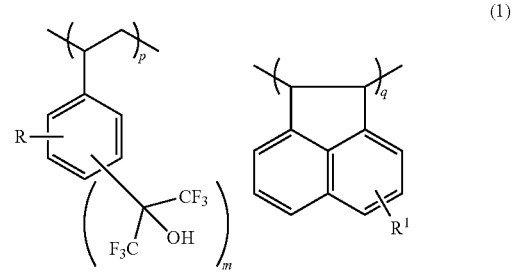

(1)

R is hydrogen, hydroxyl. $R^1$ is hydrogen, hydroxyl, linear or branched C1-C10-alkyl, cycloalkyl, acyloxy, alkoxycarbonyl, carboxyl, —OC(=O)$R^2$. $R^2$ is linear or branched C1-C10-alkyl, cycloalkyl, or fluorinated alkyl. m is 1 or 2. p and q are positive numbers satisfying the expressions 0<p<1.0 and 0<q<1.0, and 0<p+q≤1.0.

The resist top coat composition may be soluble in an alkaline developer.

The resist top coat composition may include an ether solvent. The ether solvent may include diisopropyl ether, diisobutyl ether, diisopentyl ether, di-n-pentyl ether, methylcyclopentyl ether, methyl cyclohexyl ether, di-n-butyl ether, di-sec-butyl ether, di-sec-pentyl ether, di-tert-amyl ether, or di-n-hexyl ether.

The resist top coat composition may include an alcohol solvent. The alcohol solvent may include 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl- 2-pentanol, 3-methyl-3-pentanol, 4-methyl-1-pentanol, 4-methyl-2-pentanol, 4-methyl-3-pentanol, cyclopentanol, or cyclohexanol.

The resist top coat composition may include at least 50 mass % of the ether solvent.

The base resin may include a repeating unit r and/or a repeating unit s having chemical formula 4:

Chemical formula 4

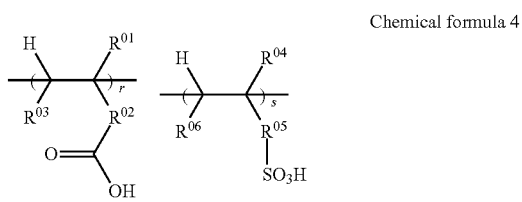

$R^{01}$ is hydrogen, methyl, —COOH, or —CH$_2$COOH. $R^{02}$ is a direct bond, linear or branched C1-C10-alkylene, wherein the alkylene may have an ether group, an ester group, cycloalkylene, phenylene, or naphthylene. $R^{03}$ is hydrogen, or C4-C12-alkylene. $R^{02}$ and $R^{03}$ may be linked together to form a ring of C4 to C16 alkylene. $R^{04}$ is hydrogen, or methyl. $R^{05}$ is a direct bond, linear or branched C1-C10-alkylene, wherein the alkylene may have an ester group, cycloalkylene, or phenylene. $R^{06}$ is hydrogen, or C4-C12-alkylene and r≥0, and s≥0. $R^{05}$ and $R^{06}$ may be linked together to form a ring of C4 to C16 alkylene The repeating unit p of styrene having a 1,1,1,3,3,3-hexafluoro-2-propanol group, the repeating unit q of acenaphthylene, the repeating unit r, and the repeating unit s may be in the range of 0.1≤p<1.0, 0<q≤0.9, 0.5≤p+q≤1.0, and 0≤(r+s)≤0.5.

The average molecular weight of the base resin may be 1,000 to 10,000.

According to an exemplary embodiment of the present inventive process, a patterning process includes forming a resist top coat by using a resist top coat composition on a photoresist film formed on a wafer. A patterning process is performed by lithography using the resist top coat. The photoresist film is exposed to light and the photoresist is developed with a developer. The resist top coat composition includes a polymer including a base resin having a repeating unit p of styrene having a 1,1,1,3,3,3-hexafluoro-2-propanol group and a repeating unit q of acenaphthylene having chemical formula 1.

The patterning process may be performed under a vacuum.

The exposure wavelength of the exposing light may be in a range of 3 nm to 15 nm, or the exposing light may be an electron beam.

The developer may be an alkaline developer. The resist top coat may be removed substantially simultaneously with the development of the photoresist film.

The resist top coat composition may include an acid generator.

The resist top coat may include an amine quencher.

The amount of the amine quencher may be 0.1 parts to 1 part by mass relative to 100 parts by mass of the base resin.

DETAILED DESCRIPTION

A resist top coat composition and patterning process according to exemplary embodiments of the present inventive concept will be described in more detail below.

By using the resist top coat composition according to exemplary embodiments of the present inventive concept, head enlargement of a resist pattern due to an amine contamination in air may be reduced, and resist film sensitivity may be increased due to a sensitization effect on a resist film. Generation of an outgoing gas from the resist film by exposure under vacuum may be reduced. The resist top coat composition according to exemplary embodiments of the present inventive concept may be soluble in an alkaline developer, and removal of a top coat may be performed simultaneously with development of the resist film. The top coat composition according to exemplary embodiments of the present inventive concept might not dissolve the resist film or form a mixing layer, and a change in the resist form after development might not occur. An out-of-band (OOB) light that may have a wavelength of about 140 nm to about 300 nm and that may be generated by an EUV laser may be absorbed and the photoresist may be protected from being sensitized. The resist top coat composition according to exemplary embodiments of the present inventive concept may be dissolved into an ether solvent or an alcohol solvent that does not dissolve a resist layer. The resist top coat composition according to exemplary embodiments of the present inventive concept may do little or no damage to a resist layer, might not form a mixing layer between a top coat and a resist layer, and may reduce film loss of the resist pattern after development.

A polymer, which may be used as a top base material in the resist top coat composition according to an exemplary embodiment of the present inventive concept, is shown in chemical formula 1, and includes both a repeating unit of styrene having a 1,1,1,3,3,3-hexafluoro-2-propanol group and a repeating unit of acenaphthylene.

Chemical formula 1

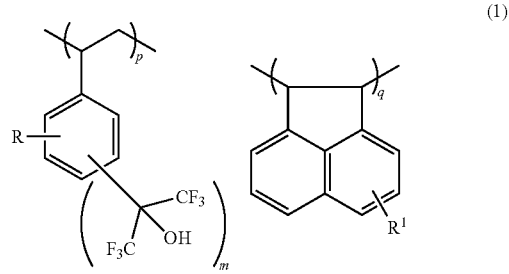

wherein R is hydrogen, hydroxyl; $R^1$ is hydrogen, hydroxyl, linear or branched C1-C10-alkyl, cycloalkyl, acyloxy, alkoxycarbonyl, carboxyl, —OC(=O)$R^2$ ($R^2$ is linear or branched C1-C10-alkyl, cycloalkyl, fluoroalkyl); m is 1 or 2; and p, q are positive number satisfying the expressions 0<p<1.0, 0<q<1.0, and 0<p+q≤1.0.

The polymer having a repeating unit of styrene having a 1,1,1,3,3,3-hexafluoro-2-propanol group may be highly soluble in an ether solvent that does not damage a resist film. Shown below in chemical formula 2 are exemplary monomers to obtain a repeating unit p.

Chemical formula 2

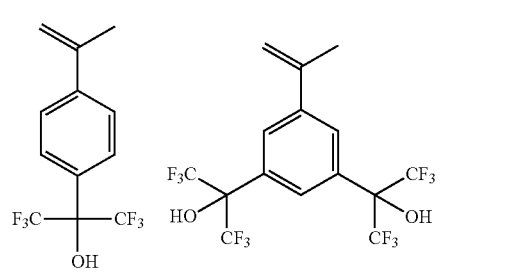

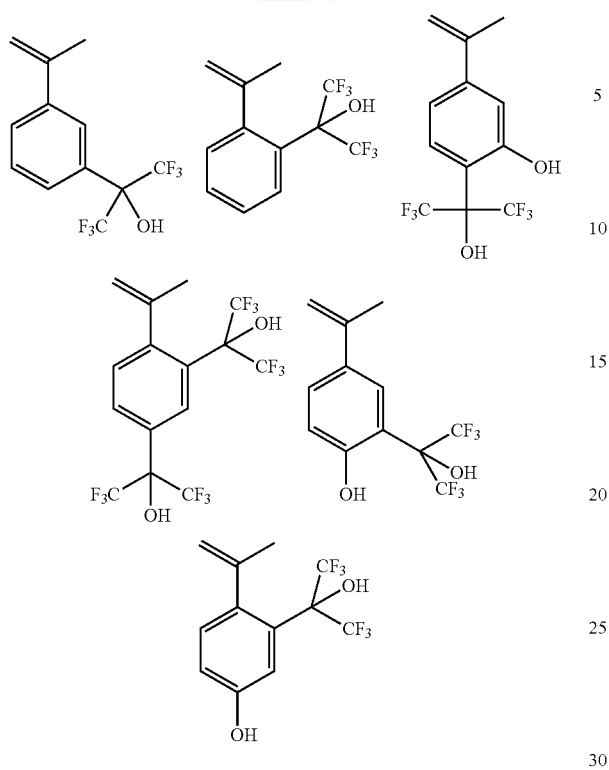
Exemplary monomers of acenaphthylene to obtain the repeating unit q may include the following monomers illustrated in chemical formula 3.
Chemical formula 3
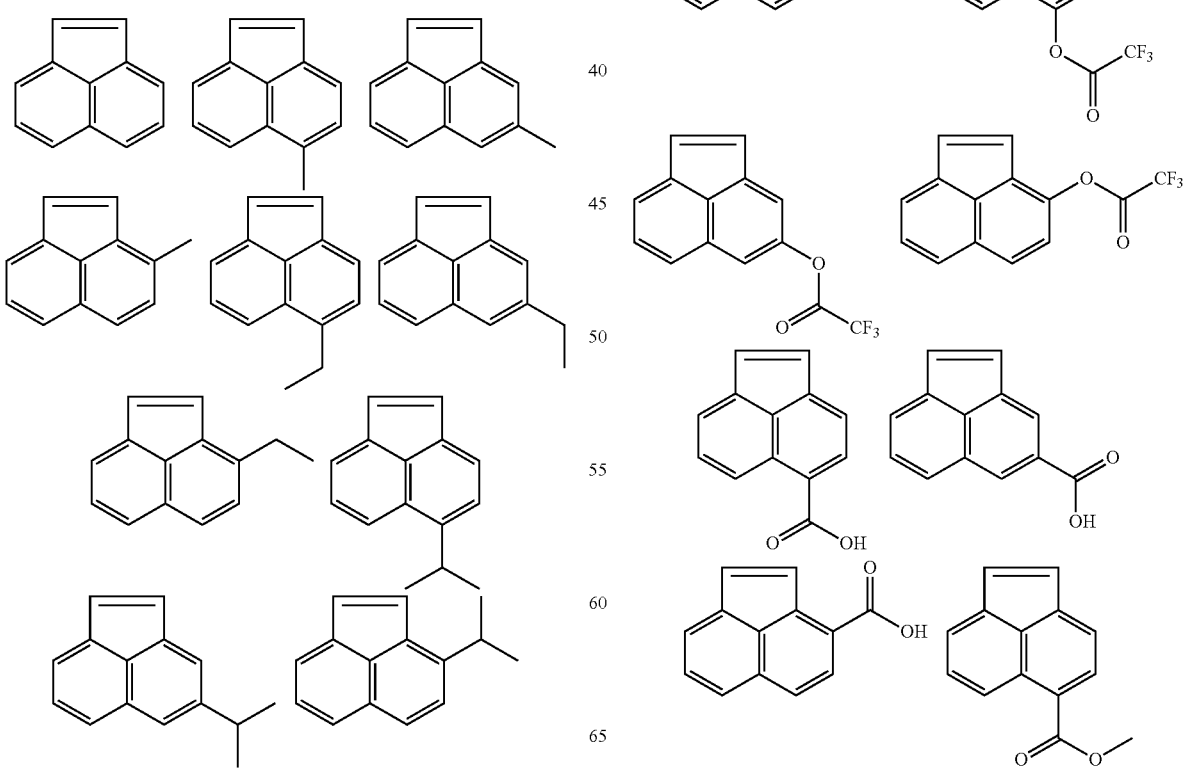
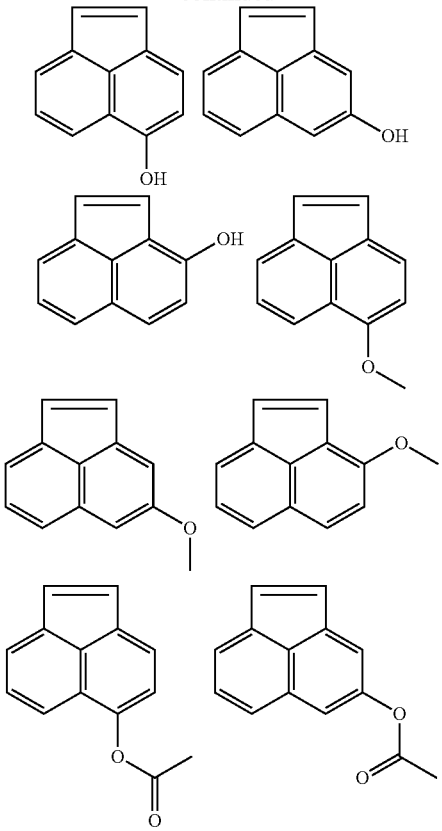

-continued

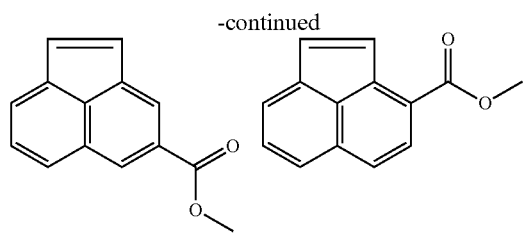

The resist top coat composition according to exemplary embodiments of the present inventive concept may include the polymer composed of the repeating unit p of styrene having a 1,1,1,3,3,3-hexafluoro-2-propanol group, which may be alkaline soluble, and the repeating unit q of acenaphthylene, which may increase the ability of the resist top coat composition to block an outgoing gas from the resist film during exposure to an EUV light. Acenaphthylene may be used as a component of the polymer, and may reduce the generation of an outgoing gas, and may increase the absorption of an OOB light.

The polymer used as a base resin for the top coat according to exemplary embodiments of the present inventive concept may have the repeating units p and q in any combination. A repeating unit r having a carboxyl group and/or a repeating unit s having a sulfo group may be copolymerized and may increase the alkali solubility of the top coat.

Exemplary repeating units r and s are shown in chemical formula 4 below.

Chemical formula 4

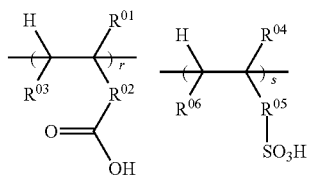

$R^{01}$ is hydrogen, methyl, —COOH, or —CH$_2$COOH; $R^{02}$ is a direct bond, linear or branched C1-C10-alkylene, wherein the alkylene may have an ether group or an ester group, cycloalkylene, phenylene, or naphthylene; $R^{03}$ is hydrogen, C4-C12-alkylene bridged together with $R^{02}$, $R^{04}$ is hydrogen or methyl; $R^{05}$ is a direct bond, linear or branched C1-C10-alkylene, wherein the alkylene may have an ester group, cycloalkylene or phenylene; and $R^{06}$ is hydrogen or C4-C12-alkylene bridged together with $R^{05}$; and r≥0, and s≥0. $R^{02}$ and $R^{03}$ may be linked together to form a ring of C4 to C16 alkylene. $R^{05}$ and $R^{06}$ may be linked together to form a ring of C4 to C16 alkylene The repeating unit p of styrene having the 1,1,1,3,3,3-hexafluoro-2-propanol group, the repeating unit q of acenaphthylene, the repeating unit r of a chain having the carboxyl group, and the repeating unit s having the sulfonyl group may be in the range of 0.1≤p<1.0, 0<q≤0.9, 0.5≤p+q≤1.0, and 0≤(r+s)≤0.5; for example, 0.2≤p≤0.95, 0.05≤q≤0.8, 0.6≤p+q≤1.0, and 0≤(r+s)≤0.4; or for example, 0.3≤p≤0.9, 0.1≤q≤0.7, 0.7≤p+q≤1.0, and 0≤(r+s)≤0.3, wherein p+q+r+s=1.0; and if 0<(r+s), then p+q<1.0.

The weight-average molecular weight (Mw) of the polymer containing the repeating unit p of styrene having the 1,1,1,3,3,3-hexafluoro-2-propanol group, and the repeating unit q of acenaphthylene may be 1,000 to 10,000 based on that of the polystyrene determined by gel permeation chromatography (GPC). If the molecular weight exceeds 10,000, the solubility of the polymer in the solvent and the alkaline developer may decrease. If the Mw is less than 10,000, mixing between the polymer and the resist film may occur, and film loss of the resist pattern after development may occur.

The polymerization of the polymer of the resist top coat composition according to exemplary embodiments of the present inventive concept may be initiated by a radical polymerization initiator such as AIBN (azobisisobutyronitrile) or by an ion derived from a catalyst such as alkyllithium. The polymerization may be carried out in accordance with processes known in the art. Examples of the radical polymerization initiator include the following, however, the radical polymerization initiator is not limited thereto: azo-compounds, including, for example, 2,2'-Azobis(4-methoxy-2,4-dimethylvaleronitrile), 2,2'-Azobis(2,4-dimethylvaleronitrile), and 2,2'-azobisisobutyronitrile, 2,2'-Azobis(2,4,4-trimethylpentane); peroxide compounds, including, for example, tert-butyl peroxypivalate, lauroyl peroxide, Benzoyl peroxide, and tert-butyl peroxy laurate; water-soluble persulfates, including, for example, potassium persulfate; and redox initiators, such as, for example, a combination of peroxides and reducing agents, including a combination of hydrogen peroxide, and sodium sulfite. Although the amount of the radical polymerization initiator used may be determined according to the type of radical polymerization initiator, polymerization reaction condition, and the like, the ratio of the radical polymerization initiator to the whole monomer used may be 0.001% to 5% by mass, for example, 0.01% to 2.00% by mass.

A polymerization solvent may be used in the polymerization reaction. The polymerization solvent may be selected from those that do not inhibit the polymerization reaction. Exemplary polymerization solvents according to exemplary embodiments of the present inventive concept are esters including, for example, ethyl acetate, or n-butyl acetate; ketones, including, for example, acetone, methyl ethyl ketone, or methyl isobutyl ketone; aliphatic series or aromatic hydrocarbons, including, for example, toluene, xylene, or cyclohexane; alcohols, including, for example, isopropyl alcohol, or ethylene glycol monomethyl ether; ether-type solvents, including, for example, diethyl ether, dioxan, tetrahydrofuran, di-n-butyl ether, di-n-amyl ether, or diisoamyl ether. The polymerization solvents may be used singly or by mixing two or more polymerization solvents. A molecular weight modifier such as, for example, dodexyl mercaptan can be simultaneously used. The temperature of the polymerization reaction may depend on the type of the polymerization initiator and on the boiling point of the solvent, which may be in a range of from about 20° C. to about 200° C., for example, in the range of from about 50° C. to about 140° C. A reactor vessel used for the polymerization reactions is not limited to a particular reactor vessel. Removal of the organic solvent or water from the polymer solution or from a polymer dispersion obtained in the polymerization reaction may be carried out by, for example, filtering after reprecipitation, or distillation under a reduced pressure.

The solvent included in the resist top coat composition may be a solvent that does not dissolve the photoresist film. Examples of solvents that may dissolve the photoresist film include those used for a resist solvent; ketones, such as, for example, cyclohexanone or methyl-2-n-amyl ketone; alcohols, such as, for example, 3-methoxybutanol, 3-methyl-3-methoxybutanol, 1-methoxy-2-propanol, or 1-ethoxy-2-propanol; ethers, such as, for example propylene glycol monomethyl ether, ethylene glycol monomethyl ether, propylene glycol monoethyl ether, ethylene glycol monoethyl ether, propylene glycol dimethyl ether, or diethylene glycol dimethyl ether; and esters, such as, for example, propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, or propylene glycol mono-tert-butyl ether acetate.

Exemplary solvents that do not dissolve a photo resist film and that may be used in the resist top coat composition according to exemplary embodiments of the present inventive concept include the following ether solvents: diisopropyl ether, diisobutyl ether, diisopentyl ether, di-n-pentyl ether, methylcyclopentyl ether, methyl cyclohexyl ether, di-n-butyl ether, di-sec-butyl ether, di-sec-pentyl ether, di-tert-amyl ether, or di-n-hexyl ether. The ether solvents may be blended with higher alcohols having 4 or more carbon atoms. Examples of higher alcohols having 4 or more carbon atoms include 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclopentanol, or cyclohexanol. Intermixing with the resist film can be avoided by adding, to the higher alcohol having 4 or more carbon atoms, an ether solvent such as, for example, diisopropyl ether, diisobutyl ether, diisopentyl ether, di-n-pentyl ether, methyl cyclopentyl ether, methyl cyclohexyl ether, di-n-butyl ether, di-sec-butyl ether, di-sec-pentyl ether, di-t-amyl ether, or di-n-hexyl ether, or an aromatic solvent such as, for example, toluene, xylene, mesitylene, ethyl benzene, propyl benzene, butyl benzene, t-butyl benzene, or anisole. The ether solvent may be about 50% by mass or more, or for example, 60% by mass or more, relative to the total mass of the solvent.

The resist top coat composition used in the patterning process according to exemplary embodiments of the present inventive concept may include an acid generator that can generate an acid by an active beam or by a radiation beam (photo acid generator). Compounds that can generate an acid by exposure to a high energy beam as described above may be used as the acid generator. Examples of acid generators include sulfonium salts, iodonium salts, N-sulfonyl oxyimides, or oxime-O-sulfonates. Acid generators may be used singly or as a mixture of two or more acid generators. By adding the acid generator to the resist top coat composition, a bridging defect between the resist patterns after development may be reduced. An amount of the acid generator included in the resist top coat composition may be from 0 parts to about 10 parts by mass relative to about 100 parts by mass of the base resin, and when the acid generator is blended, the blending amount may be from 0.1 parts to about 5 parts by mass.

The resist top coat composition used in the patterning process according to exemplary embodiments of the present inventive concept may include an amine quencher. When including the amine quencher, the rectangularity of the resist pattern after development may be increased. When the acid generator and the amine quencher are used concurrently, the LWR of the resist pattern may be lowered. The amount of the amine quencher included in the top coat composition may be from 0 parts to about 20 parts by mass relative to about 100 parts by mass of the base resin, and when the amine quencher is blended, the blending amount may be from 0.1 parts to 1 part by mass.

Surfactants may be included in the resist top coat composition according to exemplary embodiments of the present inventive concept. The amount of surfactant added to the resist top coat composition may be from 0.0001 parts to about 10 parts by mass, for example, 0.001 parts to about 5 parts by mass, relative to about 100 parts by mass of the top coat base resin.

A photoresist composition used in the patterning according to exemplary embodiments of the present inventive concept may include a chemically amplified positive resist, and may, for example, include a repeating unit e in which an acid labile group is bonded to the carboxyl group, and/or a repeating unit f in which an acid labile group is bonded to the hydroxyl group, which is/are shown in chemical formula 5 below. The photoresist composition may include a repeating unit in which an acid generating group is bonded to the main chain, and edge (LWR) roughness may be reduced.

The weight-average molecular weight of the polymer used as the base resin in the resist top coat composition may be in the range of from about 1,000 to 500,000, for example, in the range of from about 2,000 to about 30,000, and may be based on that of the polystyrene determined by GPC. By using the polymer with the molecular weight of about 1,000 or more, the resist top coat composition may have relatively high heat resistance, and by using the polymer with the molecular weight of about 500,000 or less, the resist top coat composition may have a relatively high alkaline-dissolvability and might not cause a footing profile phenomenon after patterning.

In the polymer included in the resist top coat composition, when the molecular weight distribution (Mw/Mn) of a multicomponent copolymer is relatively wide, foreign matter can appear on the pattern after exposure, or a pattern profile might be deteriorated, because both the polymer having a low molecular weight and the polymer having a high molecular weight are included. The molecular weight distribution of a multicomponent copolymer according to exemplary embodiments of the present inventive concept, may be in the range of from about 1.0 to about 2.0, or for example in the narrow-dispersion range of from about 1.0 to about 1.5, and a resist composition top coat composition for use in a fine pattern may be formed.

The patterning process using the resist top coat composition according to exemplary embodiments of the present inventive concept is described below in more detail. The patterning process according to exemplary embodiments of the present inventive concept may include the following steps: forming the photoresist film on a substrate; forming the resist top coat on the photoresist film by using the resist top coat composition according to exemplary embodiments of the present inventive concept; exposing; and developing using a developer.

A photoresist film may be formed on the substrate. The photoresist film may be formed, for example, by a spin coating method. To reduce the dispense amount of the photoresist film composition during spin coating, the photoresist film composition may be dispensed by spin coating when the substrate is being wetted by a solvent for the photoresist or by a solution mixed with the solvent for the photoresist. The spin coating method according to exemplary embodiments of the present inventive concept may reduce the dispense amount of the photoresist film composition. The film thickness of the resist film may be in the range of from about 5 nm to about 500 nm, for example, from about 10 nm to about 300 nm.

The resist top coat may be formed on the photoresist film by using the resist top coat composition according to exemplary embodiments of the present inventive concept. The resist top coat may be formed, for example, by the spin coating method. In spin coating of the resist top coat composition, the same, or a similar process as for the photoresist film described above may be used, and thus the resist top coat composition may be applied after the surface of the photoresist film is wetted by the solvent but before the resist top coat composition is applied. The film thickness of the resist top coat formed may be in the range of from about 2 nm to about 200 nm, for example, from about 5 nm to about 50 nm. To wet the surface of the photoresist film by the solvent, a rotation coating method and a vapor prime method may be used. The solvent used during the process of wetting the surface of the photoresist film may be an ether solvent in which the photoresist film does not dissolve or an ether solvent blended with a higher alcoholic solvent.

The alkaline-dissolution rate of the resist top coat according to exemplary embodiments of the present inventive concept may be about 3 nm/second or higher, for example, about 5 nm/second or higher.

After the top coat is formed on the resist film, exposure may be performed. The wavelength of the exposing light may be in the range of from about 3 nm to about 15 nm, or an electron beam may be used in the exposure. The exposure of both EUV and EB may be performed in a vacuum. After the exposure, baking (e.g., post-exposure bake: PEB) may be performed as desired, followed by development. The development process may be performed, for example, in an alkaline developer for from about 3 seconds to about 300 seconds. The alkaline developer may be an aqueous tetramethylammonium hydroxide solution, with the concentration thereof being about 2.38% by mass. An aqueous tetrabutylammonium hydroxide solution may also be used in place of the aqueous tetramethylammonium hydroxide solution. In this case, it is preferable that, in the development process, the development may be performed by the alkaline developer to form the resist pattern on the photoresist film, and that the resist top coat on the photoresist film be removed substantially simultaneously. By doing so, removal of the resist top coat can be performed without installing removal equipment. Process steps such as etching, resist removal, washing, and the like may be performed.

Exemplary embodiments of the present inventive concept will be described in more detail below by showing examples and comparative examples, but the present inventive concept is not limited to the following exemplary embodiments.

Polymers used in exemplary embodiments of the present inventive concept and comparative examples will be described below in more detail. The polymers may include the repeating unit of styrene having the 1,1,1,3,3,3-hexafluoro-2-propanol group and the repeating unit of acenaphthylene.

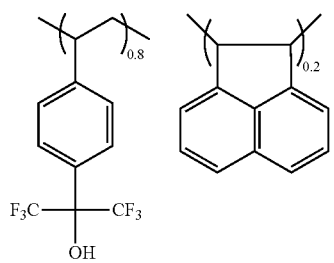

Chemical formula 5

Top coat polymer 1
Mw 7,800
Mw/Mn 1.66

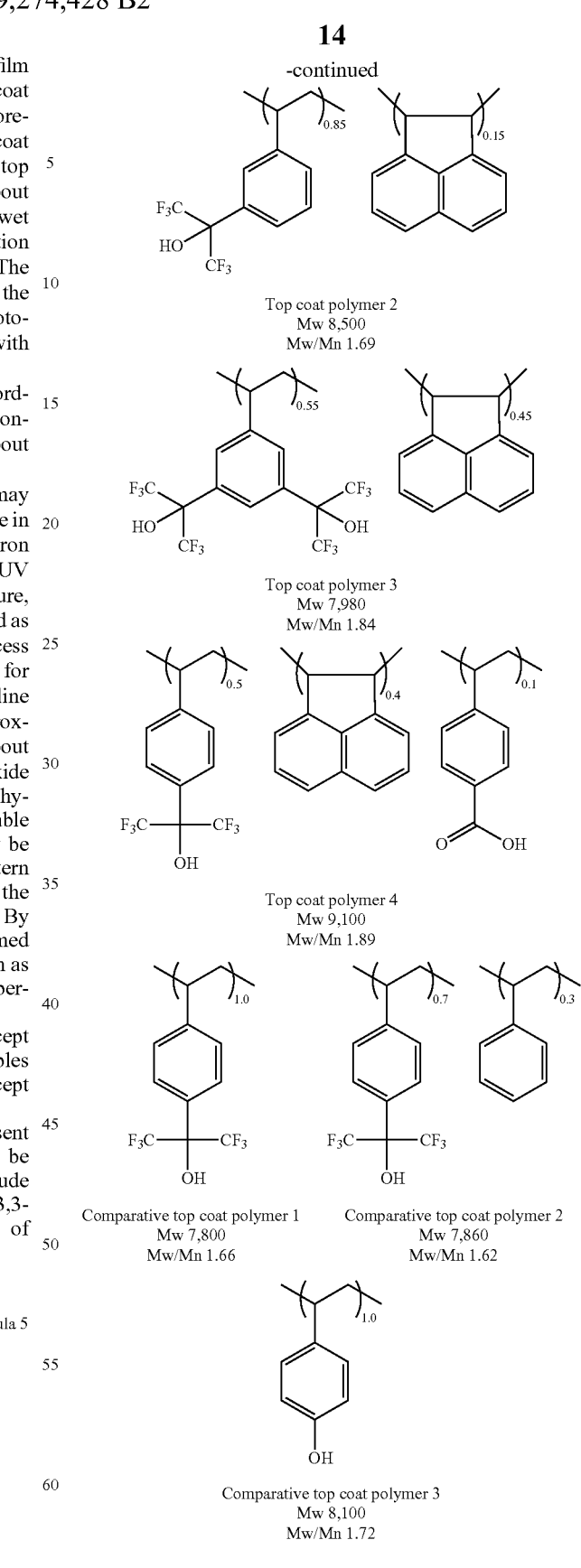

Figure 2:
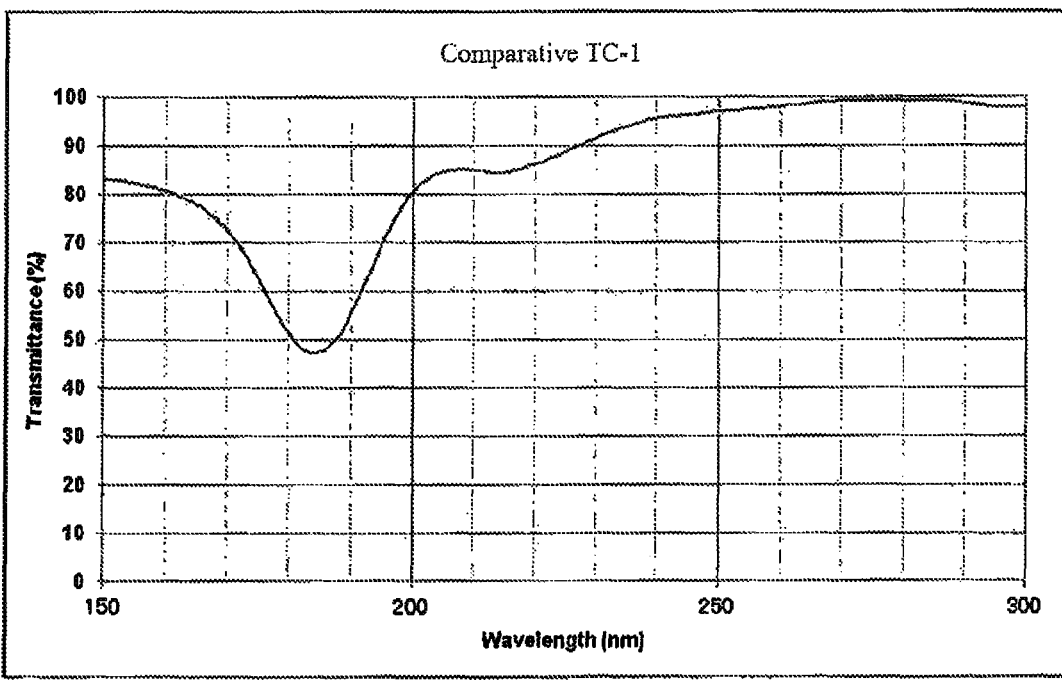
FIG. 2 is a chart showing spectral characteristics of a comparative top coat solution Comparative TC-1.
Figure 3:
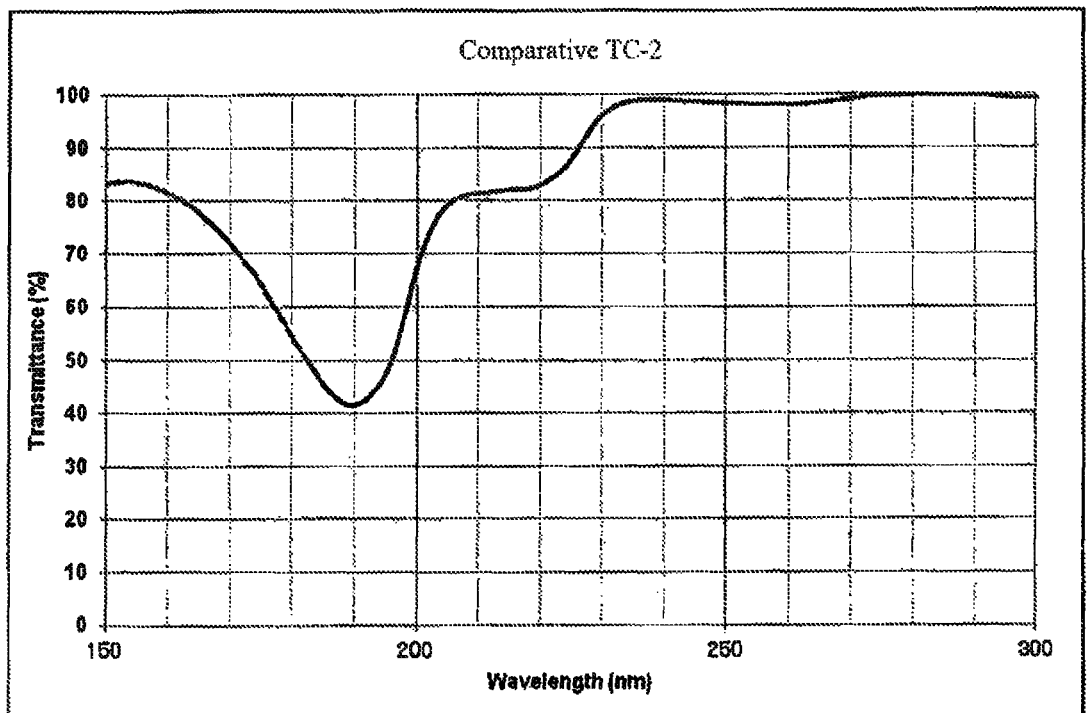
FIG. 3 is a chart showing spectral characteristics of a comparative top coat solution Comparative TC-2.
Figure 4:
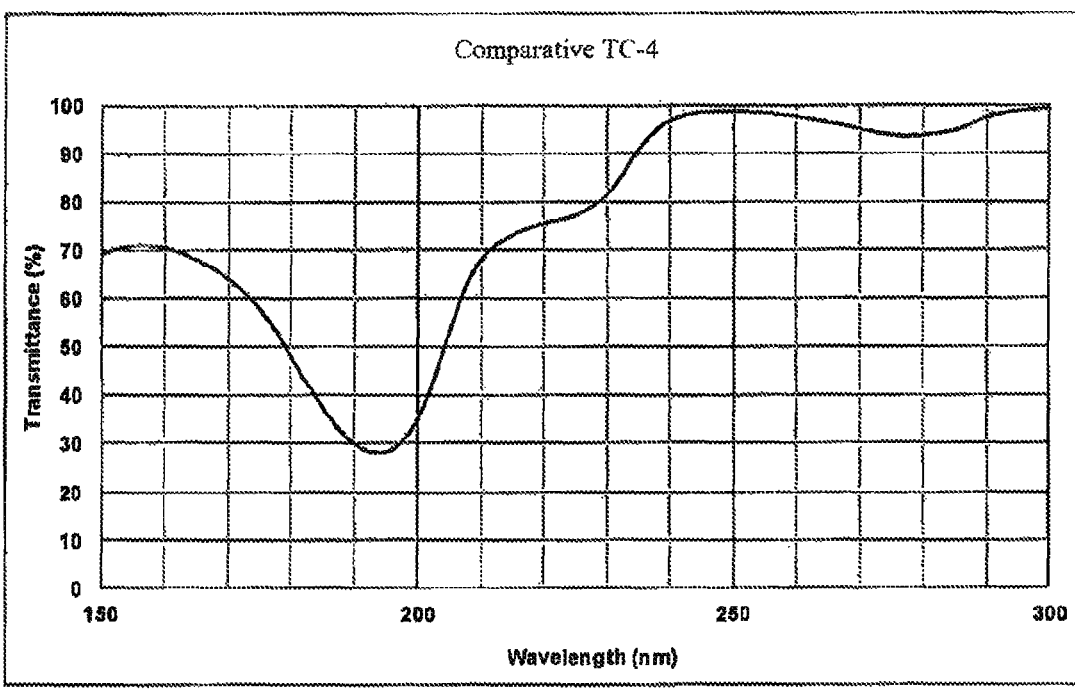
FIG. 4 is a chart showing spectral characteristics of a comparative top coat solution Comparative TC-4.

Referring to FIGS. 1-4, the resist top coat solutions TC-1-TC-12 and Comparatives TC-1-TC-4 were prepared with the compositions as shown in Table 1, which may contain top coat polymers, additives, and solvents. In comparative TC-3, the comparative resist top coat polymer-3 was not fully dissolved into diisopentyl ether.

TABLE 1

| Resist Top Coat Solution | Base Material (parts by mass) | Additives (parts by weight) | Solvent (parts by mass) |
|---|---|---|---|
| TC-1 | top coat polymer 1 (10) | | diisopentyl ether (550) |
| TC-2 | top coat polymer 2 (10) | | diisopentyl ether (550) |
| TC-3 | top coat polymer 3 (10) | | diisopentyl ether (550) |
| TC-4 | top coat polymer 4 (10) | | diisopentyl ether (550) |
| TC-5 | top coat polymer 1 (10) | | diisopentyl ether (400) 4-methyl-2-pentanol (200) |
| TC-6 | top coat polymer 1 (10) | | diisopentyl ether (500) 2-methyl-1-butanol (100) |
| TC-7 | top coat polymer 1 (10) | | diisopentyl ether (500) 3-methyl-3-pentanol (100) |
| TC-8 | top coat polymer 1 (10) | | diisopentyl ether (500) 2-methyl-2-pentanol (100) |
| TC-9 | top coat polymer 1 (10) | | diisopentyl ether (500) 2-methyl-3-pentanol (100) |
| TC-10 | top coat polymer 1 (10) | | diisopentyl ether (400) 3-methyl-2-pentanol (200) |
| TC-11 | top coat polymer 1 (10) | tri-n-octylamine (0.01) | diisopentyl ether (550) |
| TC-12 | top coat polymer 1 (10) | 1-aminopyrene (0.01) | diisopentyl ether (550) |
| Comparative TC-1 | comparative top coat polymer 1 (10) | | diisopentyl ether (550) |
| Comparative TC-2 | comparative top coat polymer 2 (10) | | diisopentyl ether (550) |
| Comparative TC-3 | comparative top coat polymer 3 (10) | | diisopentyl ether (550) |
| Comparative TC-4 | comparative top coat polymer 3 (10) | | 4-methyl-2-pentanol (700) |

The resist top coat solutions TC-1 to TC-12 and Comparatives TC-1, TC-2, and TC-4 were applied on a silicon substrate by spin coating, and then baked at 100° C. for 60 seconds to obtain the resist top coats having a film thickness of 20 nm (TC-1 to TC-12, and Comparatives TC-1, TC-2, and TC-4). Then, development of the silicon substrate having the resist top coat formed thereon by the foregoing method was performed in an aqueous tetramethylammonium hydroxide solution (TMAH) having a concentration of 2.38% by mass for 30 seconds, and then the film thickness of the resist top coat after development was measured. The results thereof are shown in the following Table 2. It was confirmed that the entirety of the resist top coat was dissolved after development.

TABLE 2

| Resist Top Coat | Film Thickness After Development (nm) |
|---|---|
| TC-1 | 0 |
| TC-2 | 0 |
| TC-3 | 0 |
| TC-4 | 0 |
| TC-5 | 0 |
| TC-6 | 0 |
| TC-7 | 0 |
| TC-8 | 0 |
| TC-9 | 0 |
| TC-10 | 0 |
| TC-11 | 0 |
| TC-12 | 0 |
| Comparative TC-1 | 0 |
| Comparative TC-2 | 0 |
| Comparative TC-4 | 0 |

The spectral characteristics of the resist top coats of TC-1, Comparative TC-1, Comparative TC-2, and Comparative TC-4, each of which has a film thickness of 20 nm on an Si substrate, were measured using the spectroscopic ellipsometry VUV-VASE 400 manufactured by J. A. Woolam Co. The results are shown in FIGS. 1-4. The resist top coat of TC-1 has an absorption of 20% or more in a wavelength range of 150 nm to 230 nm. In contrast, the resist top coat of Comparative TC-1 and Comparative TC-2 had a relatively low absorption in a wavelength range of 200 nm or more, yielding an absorption of 20% or less. The resist top coat of TC-4 has an absorption of 20% or more in a wavelength range of 150 nm to 230 nm, which is the same as that of TC-1, but the composition of Comparative TC-4 is not soluble in an ether solvent that does not cause damage to a resist film.

The alkaline-dissolution rate of the resist top coat of TC-1, which is formed on an Si substrate and has a film thickness of 20 nm, and is soaked in an aqueous tetramethylammonium hydroxide solution (TMAH) having a concentration of 2.38% by mass, was measured using an RDA-800 made by Litho Tech Japan Corporation. The alkaline-dissolution rate thereof was 157 nm/second.

EUV-Exposure Evaluation

The photoresist composition used for the exposure evaluation was the EUV resist composition SEVR-140, manufactured by Shin-Etsu Chemical Co., Ltd. The resist composition was applied on an Si wafer having a diameter of 300 mm and that was pre-treated by baking at a temperature of 200° C., then vapor primed with hexamethyldisilazane (HDMS), and then baked at a temperature of 105° C. for 60 seconds to form a resist film having a film thickness of 50 nm. Then a top coat solution was applied on the resist film, which was baked at a temperature of 100° C. for 60 seconds to obtain a resist top coat having a film thickness of 20 nm. The entirety of the wafer thereof was exposed to a light that had been adjusted to an exposure amount such that one shot had a size of 26 mm×33 mm and the 34-nm line-and-space pattern was 1:1, by using an EUV scanner NXE 3100 (NA of 0.25 and δ of 0.8 with normal illumination) manufactured by ASML, and then baked (PEB) at a temperature of 95° C. for 60 seconds, and development was made in an aqueous tetramethylammonium hydroxide solution (TMAH) with a concentration of 2.38% by mass for 30 seconds. The width of the line-and-space pattern was measured at 50 points within a shot by using a length-measuring SEM, and the difference between the maximum width and the minimum width within the shot of each Example and Comparative Example was calculated. The larger the effects of OOB light, the larger the difference became between the maximum width and minimum width within a shot. The edge roughness (LWR) in the center of the shot for each of the examples and comparative examples was measured at the same time. The results of the measurements above are shown in Table 3.

TABLE 3

| Resist Name | Resist Top Coat | Sensitivity (mJ/cm²) | LWR (nm) | Maximum Difference of Line Width within a Shot (nm) |
|---|---|---|---|---|
| Example 1 | SEVR-140 | TC-1 | 15.27 | 5.28 | 1.79 |
| Example 2 | SEVR-140 | TC-2 | 15.33 | 5.21 | 1.80 |
| Example 3 | SEVR-140 | TC-3 | 15.55 | 5.21 | 1.71 |
| Example 4 | SEVR-140 | TC-4 | 14.06 | 5.20 | 1.72 |
| Example 5 | SEVR-140 | TC-5 | 15.11 | 5.28 | 1.80 |
| Example 6 | SEVR-140 | TC-6 | 15.11 | 5.29 | 1.80 |
| Example 7 | SEVR-140 | TC-7 | 15.20 | 5.21 | 1.81 |
| Example 8 | SEVR-140 | TC-8 | 15.18 | 5.21 | 1.79 |
| Example 9 | SEVR-140 | TC-9 | 15.24 | 5.28 | 1.80 |
| Example 10 | SEVR-140 | TC-10 | 15.21 | 5.28 | 1.78 |
| Example 11 | SEVR-140 | TC-11 | 15.30 | 5.11 | 1.73 |
| Example 12 | SEVR-140 | TC-12 | 15.33 | 5.19 | 1.71 |
| Comparative Example 1 | SEVR-140 | Comparative TC-1 | 16.08 | 5.12 | 1.89 |
| Comparative Example 2 | SEVR-140 | Comparative TC-2 | 15.31 | 5.31 | 1.86 |
| Comparative Example 3 | SEVR-140 | Comparative TC-4 | 13.49 | 5.53 | 2.07 |
| Comparative Example 4 | SEVR-140 | | 13.28 | 5.11 | 1.94 |

By using the resist top coat composition according to exemplary embodiments of the present inventive concept, the maximum difference of the line width within a shot can be reduced. The resist top coat according to exemplary embodiments of the present inventive concept may have smaller maximum differences of line width within the shots, and may have lower sensitivity reductions than Comparative Example 1 and Comparative Example 2. Sensitivity reduction may be caused by absorption of EUV light by a resist top coat, and when the resist top coat composition according to exemplary embodiments of the present inventive concept is used an increase of transparency by EUV light may be achieved by copolymerization with acenaphthylene. As in Comparative TC-2, copolymerization with styrene may increase transparency by EUV light and reduce the decrease in sensitivity, but copolymerization with styrene might not increase absorption of light having a wavelength 200 nm, and therefore a relatively small amount of OOB light may be excluded, and relatively large maximum differences of line width within shots may occur. TC-4 may be highly effective in excluding OOB light, but might not be soluble in an ether solvent and damage to a resist pattern may occur, whereby the LWR may become larger, and variation of line width within shots may be increased.

While the inventive concept has been particularly shown and described with reference to exemplary embodiments thereof, it will be understood by those of ordinary skill in the art that various changes in form and detail may be made therein without departing from the spirit and scope of the present inventive concept.

What is claimed is:

1. A resist top coat composition, comprising:
a copolymer having a repeating unit p of styrene having a 1,1,1,3,3,3-hexafluoro-2-propanol group and a repeating unit q of acenaphthylene having chemical formula 1, wherein the copolymer is dissolved in an ether solvent, and wherein the ether solvent comprises one or more of diisopropyl ether, diisobutyl ether, diisopentyl ether, di-n-pentyl ether, methylcyclopentyl ether, methyl cyclohexyl ether, di-n-butyl ether, di-sec-butyl ether, di-sec-pentyl ether, di-tert-amyl ether, and di-n-hexyl ether:

Chemical formula 1

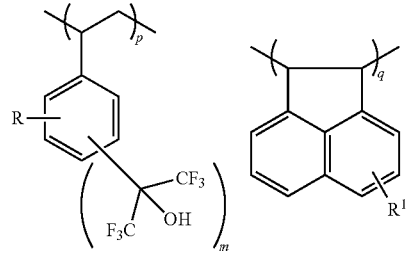

(1)

wherein:
R is hydrogen, hydroxyl;
$R^1$ is hydrogen, hydroxyl, linear or branched C1-C10-alkyl, cycloalkyl, acyloxy, alkoxycarbonyl, carboxyl, or —OC(=O) $R^2$, wherein $R^2$ is linear or branched C1-C10-alkyl, cycloalkyl, or fluorinated alkyl;
m is an integer, wherein the integer is 1 or 2;
wherein p and q are proportions of the respective repeating units in the copolymer having the expressions $0.3 \leq p \leq 0.9$, $0.1 \leq q \leq 0.7$, and $0.7 \leq p+q \leq 1$.

2. The resist top coat composition of claim 1, wherein the copolymer is soluble in an alkaline developer.

3. The resist top coat composition of claim 1, wherein the resist top coat composition further comprises, in addition to the ether solvent, an alcohol solvent comprising 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclopentanol, or cyclohexanol.

4. The resist top coat composition of claim 3, wherein the ether solvent comprises at least 50 mass % of a total of the ether solvent and the alcohol solvent.

5. The resist top coat composition of claim 1, wherein the copolymer further comprises a repeating unit r having a carboxyl group and/or a repeating unit s having a sulfo group shown below:

Chemical formula 4

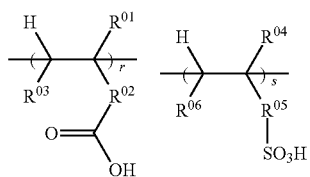

wherein:
$R^{01}$ is hydrogen, methyl, —COOH, or —CH$_2$COOH;
$R^{02}$ is a direct bond, linear or branched C1-C10-alkylene, wherein the alkylene includes an ether group, an ester group, cycloalkylene, phenylene, or naphthylene;

$R^{03}$ is hydrogen or C4-C12-alkylene;
$R^{04}$ is hydrogen or methyl;
$R^{05}$ is a direct bond, linear or branched C1-C10-alkylene, wherein the alkylene group includes an ester group, cycloalkylene, or phenylene;
$R^{06}$ is hydrogen or C4-C12-alkylene; and
wherein r and s are proportions of the respective repeating units in the copolymer, and $0<r+s\leq0.3$, $p+q+r+s=1.0$.

6. The resist top coat composition according to claim 1, wherein the average molecular weight of the copolymer is 1,000 to 10,000.

7. A patterning process using a resist top coat composition, comprising:
forming a resist top coat by depositing the resist top coat composition on a photoresist film formed on the wafer, wherein the resist top coat composition is the composition according to claim 1;
patterning the photoresist film by lithography using the resist top coat;
exposing the photoresist film to light; and
developing the photoresist film with a developer.

8. The patterning process of claim 7, wherein the exposure is performed under a vacuum.

9. The patterning process of claim 8, wherein an exposure wavelength of the exposing light is in a range of 3 nm to 15 nm, or the exposing light is an electron beam.

10. The patterning process of claim 7, wherein the developer is an alkaline developer, and wherein the resist top coat is removed substantially simultaneously with the development of the photoresist film.

11. The patterning process of claim 7, wherein the resist top coat composition further comprises an acid generator.

12. The patterning process of claim 11, wherein the resist top coat composition further comprises an amine quencher.

13. The patterning process of claim 12, wherein the amount of the amine quencher is 0.1 parts to 1 part by mass relative to 100 parts by mass of the base resin copolymer.

14. A method of patterning a photoresist film, comprising:
forming a photoresist film on a substrate;
forming a resist top coat on the photoresist film by depositing a resist top coat composition on the photoresist film, wherein the resist top coat composition comprises a copolymer including a base resin having a repeating unit p of styrene having a 1,1,1,3,3,3-hexafluoro-2-propanol group and a repeating unit q of acenaphthylene having chemical formula 1, wherein the copolymer is dissolved in an ether solvent, and wherein the ether solvent comprises one or more of diisopropyl ether, diisobutyl ether, diisopentyl ether, di-n-pentyl ether, methylcyclopentyl ether, methyl cyclohexyl ether, di-n-butyl ether, di-sec-butyl ether, di-sec-pentyl ether, di-tert-amyl ether, and di-n-hexyl ether:

Chemical formula 1

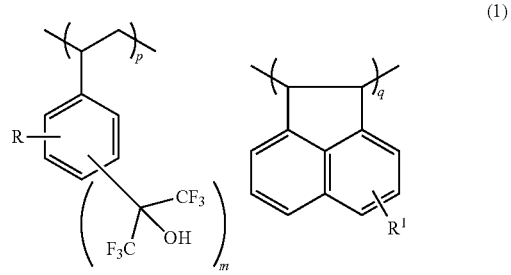

(1)

wherein:
R is hydrogen, hydroxyl;
$R^1$ is hydrogen, hydroxyl, linear or branched C1-C10-alkyl, cycloalkyl, acyloxy, alkoxycarbonyl, carboxyl, or —OC(=O) $R^2$, wherein $R^2$ is linear or branched C1-C10-alkyl, cycloalkyl, or fluorinated alkyl;
m is an integer, wherein the integer is 1 or 2; and
wherein p and q are proportions of the respective repeating units in the copolymer having the expressions $0.3\leq p\leq0.9$, $0.1\leq q\leq0.7$ and $0.7\leq p+q\leq1$; and
patterning the photoresist film using the resist top coat.

15. The method of patterning photoresist film of claim 14, wherein the photoresist film is formed by a spin coating method.

16. The method of patterning photoresist film of claim 14, wherein the resist top coat composition is soluble in an alkaline developer.

17. The method of patterning photoresist film of claim 14, wherein the deposition rate of the resist top coat composition is 5 nm/second or higher.

* * * * *